(12) United States Patent
Barnett et al.

(10) Patent No.: US 10,034,574 B2
(45) Date of Patent: Jul. 31, 2018

(54) APPARATUS AND METHOD FOR CONTROLLING AN ESPRESSO MACHINE

(71) Applicant: Synesso, Inc., Seattle, WA (US)

(72) Inventors: Mark Barnett, Seattle, WA (US); Eric Schaefer, Kent, WA (US)

(*) Notice: Subject to any disclaimer, the term of this patent is extended or adjusted under 35 U.S.C. 154(b) by 242 days.

(21) Appl. No.: 15/075,161

(22) Filed: Mar. 20, 2016

(65) Prior Publication Data

US 2016/0287007 A1  Oct. 6, 2016

Related U.S. Application Data

(60) Provisional application No. 62/197,544, filed on Jul. 27, 2015, provisional application No. 62/141,453, filed on Apr. 1, 2015.

(51) Int. Cl.
| | |
|---|---|
| *A47J 31/46* | (2006.01) |
| *H03K 17/95* | (2006.01) |
| *A47J 31/36* | (2006.01) |
| *A47J 31/52* | (2006.01) |
| *H03K 17/90* | (2006.01) |
| *H03K 17/97* | (2006.01) |
| *G05G 9/047* | (2006.01) |

(52) U.S. Cl.
CPC .......... *A47J 31/46* (2013.01); *A47J 31/3671* (2013.01); *A47J 31/52* (2013.01); *H03K 17/95* (2013.01); *G05G 2009/04755* (2013.01); *H03K 17/90* (2013.01); *H03K 17/97* (2013.01)

(58) Field of Classification Search
CPC ..................................................... H03K 17/90
See application file for complete search history.

(56) References Cited

U.S. PATENT DOCUMENTS

| | | | | |
|---|---|---|---|---|
| 6,238,721 | B1* | 5/2001 | Knepler | A47J 31/0621 |
| | | | | 141/192 |
| 8,350,484 | B2* | 1/2013 | Stanley | H05B 33/0818 |
| | | | | 200/314 |
| 2011/0094390 | A1* | 4/2011 | Bianchi | A47J 31/36 |
| | | | | 99/281 |
| 2015/0064323 | A1* | 3/2015 | Prefontaine | A47J 31/46 |
| | | | | 426/433 |

* cited by examiner

*Primary Examiner* — Jill A Warden
*Assistant Examiner* — Matthew D Krcha
(74) *Attorney, Agent, or Firm* — Eric G. Halsne

(57) ABSTRACT

An espresso machine that includes a group control head for controlling the brewing and dispensing of espresso drinks. In particular, the group control head includes a novel arrangement of proximity switches, magnets, and centering post that allows for a more efficient workflow in the controlling, automating, and duplicating the brewing of multiple doses of espresso. An associated method for using the group control head is also described.

20 Claims, 13 Drawing Sheets

Fig. 3
300
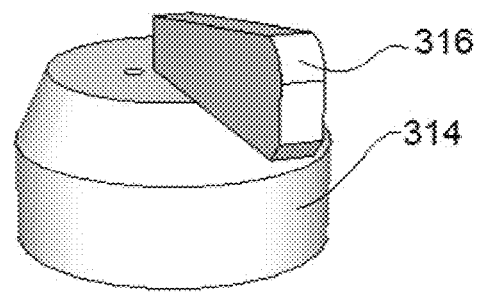
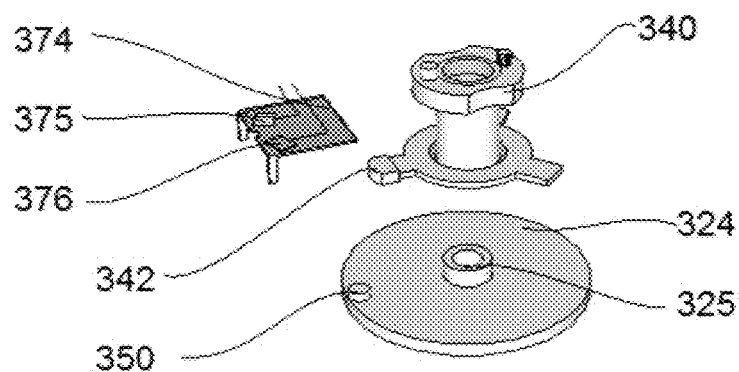
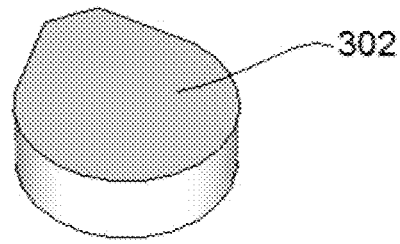

APPARATUS AND METHOD FOR CONTROLLING AN ESPRESSO MACHINE

The invention pertains to machines for brewing and dispensing espresso drinks. In particular, the invention is an apparatus and associated method for controlling, automating, and duplicating the brewing conditions for multiple doses of espresso.

Machines for preparing espresso drinks in a commercial retail environment are well known. In general, these espresso machines include a heating source for generating steam and hot water in a reservoir, a basket for holding ground espresso, and a dispensing spout. There are several increasingly sophisticated means of controlling the flow of the hot water through the espresso, out the spout, and into the cup. Perhaps the simplest means is a manually-controlled valve which is opened to permit a pressurized flow of hot water through the grounds and out the spout into a cup below. More modern machines, such as the Hydra™ espresso machine manufactured by Synesso Incorporated of Seattle Wash., incorporate computer control of the valve. The operator of such machines either presses a button or operates a toggle switch, sensed by the computer to control the valve. Some espresso machines fully automate the brewing sequence, such that a single operation of the button provides a precise dose of water through the grounds, with attendant precise control of the water temperature and driving pressure. Commercial machines may include several dispensing heads.

A commercial establishment for preparing and selling espresso drinks faces several inter-related problems, each of which is influenced by the particular espresso machine that the establishment has chosen to adopt. The first problem is one of reliability and robustness of the espresso machine. Because it is often a primary source of business revenue, the espresso machine must enjoy high operational uptime, despite a large number of operations involving high temperature water, pressure, and steam. Electromechanical parts, such as switches, potentiometers, and rheostats, are particularly susceptible to failure simply because the user is operating them constantly.

The second problem is serviceability of the espresso machine. Because existing machines have become relatively complex, the electromechanical parts such as those described above are difficult to service. Such operating parts must be protected from physical and environmental damage. Thus, the parts are usually sealed within the machine and are difficult to access.

In addition, electromechanical parts used in existing machines, such as roller switches, reed switches, etc. involve springs and other parts which degrade or change characteristics over time. Such parts, even if they don't fail, often require physical calibration for the machine to operate properly. One such prior art part is a roller or reed switch connected to a user handle, or wand, for initiating an espresso "shot". After a large number of operations, the roller or reed switch can unexpectedly break or otherwise lose its spring action and become inoperable. Such a breakdown is intolerable in a busy commercial environment, and so the switch must be routinely inspected, serviced, and calibrated. Another problem pertaining to reed switches in espresso machines is the difficulty of ensuring accuracy and consistency of operation across each of the manufactured machines. Most existing reed switches require calibration at the factory prior to shipping due to the variation in the reed switch manufacturing tolerances. Calibration of reed switches is especially critical for machines which use systems of reed switches that operate together to perform certain linear or proportional functions.

Another problem with existing espresso machines is that the operating mechanism that is available to the user is largely limited to an on/off switch or button. The competing problem to simplifying the operation for employees also serves to limit the ability of them to vary the espresso making process to account for changes in the coffee. The taste of the final espresso product can vary significantly with the type of coffee, the grind, and the age of the coffee, for example. Current machines have very limited capability for the experienced user to adjust the brew on the fly to account for these changes.

The inventors have recognized these problems in the prior art, and have arrived at a novel and ingenious solution. An improved manually operated control mechanism for an espresso machine is described here which incorporates a non-contact sensor for detecting the operating input from the user. This control mechanism is referred to as a group control head because in general the mechanism will be co-located with its respective espresso dispensing head. The sensor also has a capability for analog sensing of the input, so that an experienced user can vary the brewing process on the fly, and without the need for time-consuming programming or process set-up. The inventive group head control mechanism requires no calibration, is more reliable, and requires less servicing than prior art mechanisms. Thus, the invention simultaneously provides for a better coffee brew and increased product throughput.

In accordance with the principles of the present invention, an improved espresso brewing apparatus is described which incorporates a non-contact operating mechanism within its user control interface. The apparatus includes a novel and inventive group control head. The group head has a control handle or paddle which is connected to a magnet. When the control handle and magnet is rotated to a first position, a non-contact sensor such as a linear/proportional Hall Effect sensor senses the rotation. The sensor then provides a corresponding control input to the espresso machine dosing mechanism which may include a controller. A centering post in the mechanism provides an opposing biasing force on the magnet that returns the control handle to an idle position when the handle is released.

Also in accordance with the principles of the present invention, a group control head for dispensing a controlled dose of espresso from an espresso machine is described which comprises a base having a center axis, a top plate rigidly fixed to the base, the top plate comprising a pivot pin disposed on the center axis. The group head also includes a centering post disposed at a radial idle position offset orthogonally from the center axis, and at least one proximity sensor, such as a linear/proportional Hall Effect sensor disposed at a fixed angle from the radial idle position. An actuator is rotationally disposed on the pivot pin, the actuator including a magnet which is disposed near the radial idle position and adjacent to the centering post. A handle is affixed to the actuator. The handle is disposed to manually rotate the actuator away from the radial idle position in which the magnet is adjacent to the centering, wherein the centering post and magnet provide a biasing force that biases the actuator position to automatically return the actuator to the radial idle position. A second proximity sensor at a second fixed angle can be included to provide further operative utility.

Also in accordance with the principles of the present invention, an espresso machine which incorporates the above described group control head is described. The espresso machine also comprises an espresso dosing unit which includes a pressurized hot water brew tank, a filter for holding coffee grounds, a control valve disposed between the brew tank and the filter, and an outlet spout. A pump is disposed at an inlet of the brew tank. The machine also includes a controller that is in electrical communication with an input signal from the group control head and in controlling communication with the control valve and the pump. An actuation of the group control head handle actuates at least one of the controller, the pump and the control valve to provide a controlled dose of hot water from the source to the spout. Also in accordance with the principles of the present invention, a method is described for using the espresso machine as previously described. The method includes the steps of momentarily actuating the group head handle to an angular brew position and automatically controlling both of the pump and the valve to provide a controlled dose of hot water through the machine. A second actuation can control or stop the ongoing programmed sequence.

As used herein for purposes of the present disclosure, the term "processor" or "controller" is used generally to describe various apparatus relating to the operation of the inventive apparatus, system, or method. A processor can be implemented in numerous ways (e.g. such as with dedicated hardware) to perform various functions discussed herein. A processor is also one example of a controller which employs one or more microprocessors that may be programmed using software (e.g. microcode) to perform various functions discussed herein. A controller may be implemented with or without employing a processor, and may also be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

It is understood that the term "memory" refers to computer storage memory of types generally known in the art. Memory may be volatile or non-volatile computer memory such as RAM, PROM, EPROM, and EEPROM, floppy disks, compact disks, optical disks, magnetic tape, etc. In some implementations the computer memory media may be encoded with one or more programs that, when executed on the one or more processors and controllers, perform at least some of the functions discussed herein. Various storage media may be fixed within a processor or controller or may be transportable, such that the one or more programs stored thereon can be loaded into a processor or controller so as to implement various aspects of the present invention. The terms "program" or "computer program" are used herein in a generic sense to refer to any type of computer code (e.g. software or microcode) that can be employed to program one or more processors or controllers.

In various implementations, there terms "outputs", "inputs", "signals", and the like may be understood to be electrical or optical energy impulses which represent a particular detection or processing result.

IN THE DRAWINGS

FIG. 3 illustrates an exploded diagram of one embodiment of the inventive group control head.

Figure 4:
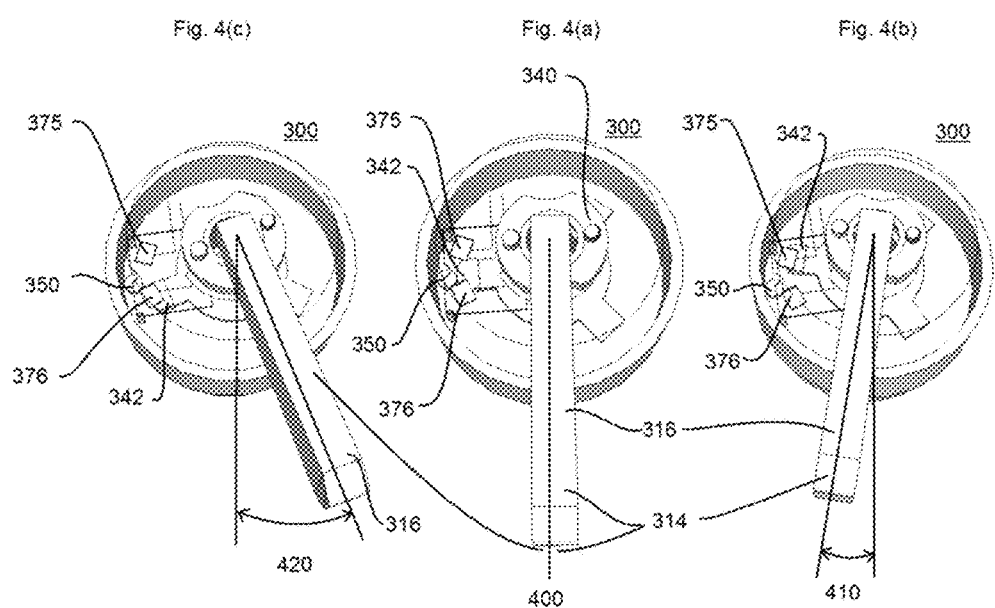

FIGS. 4(a), 4(b) and 4(c) illustrate the operation of the FIG. 3 group control head.

Figure 5:
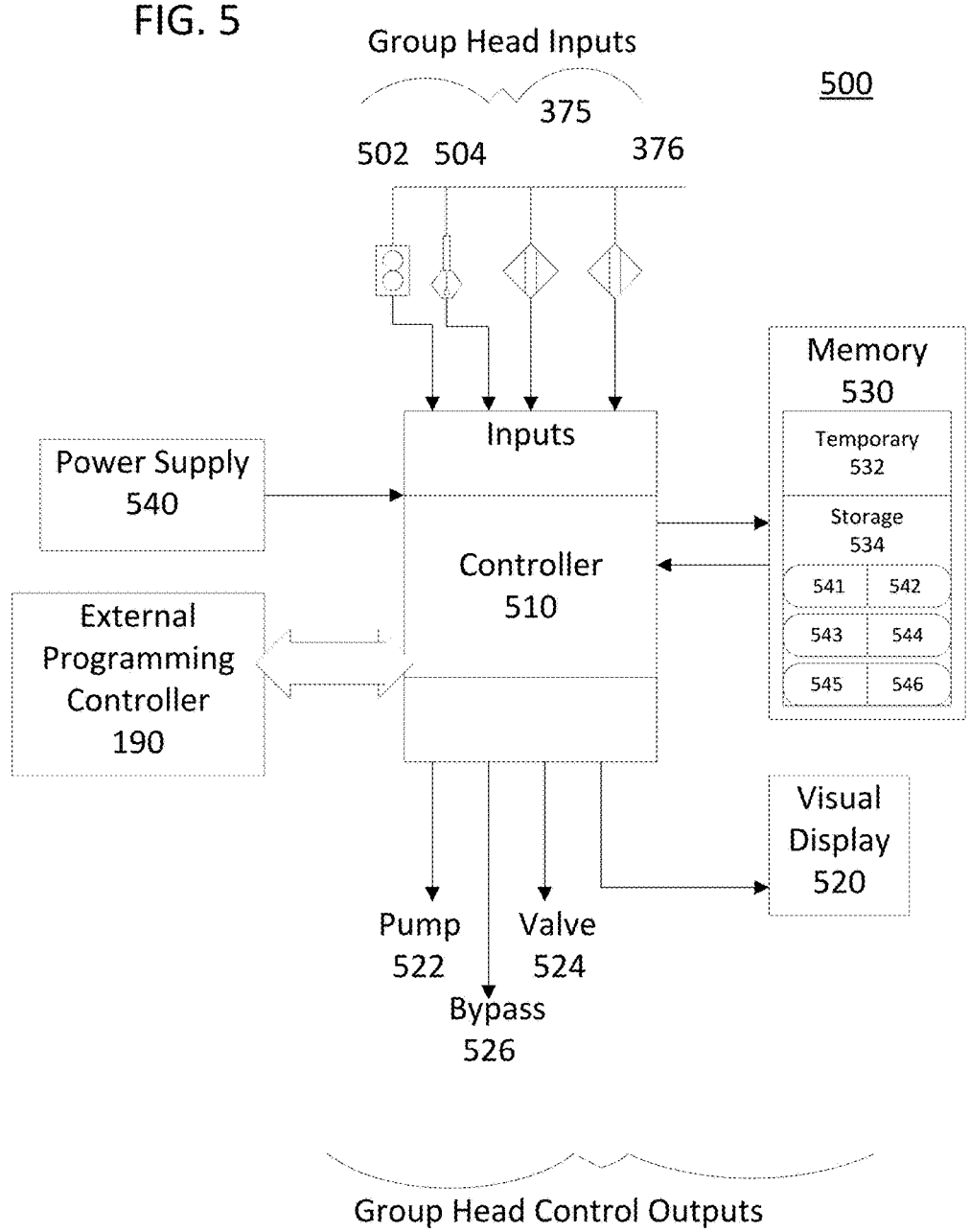

FIG. 5 is a system block diagram of one embodiment of the electrical sensing and control circuit.

Figure 6A:
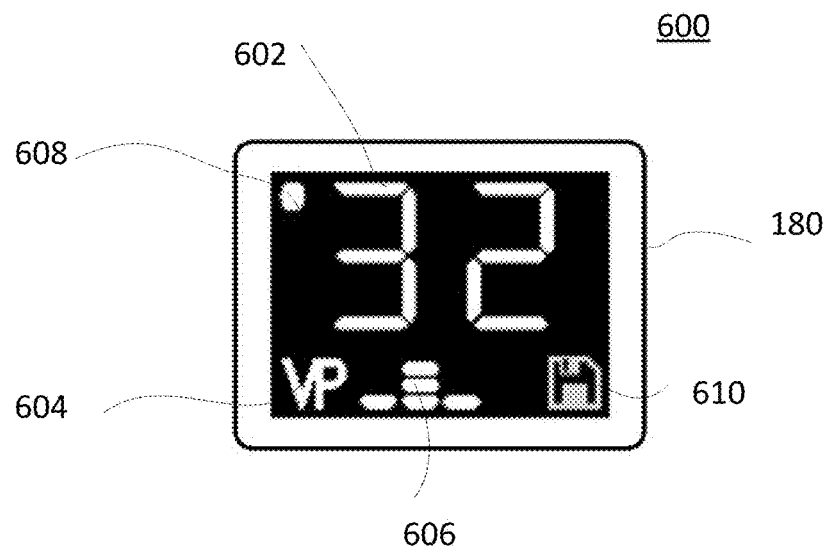
Figure 6B:
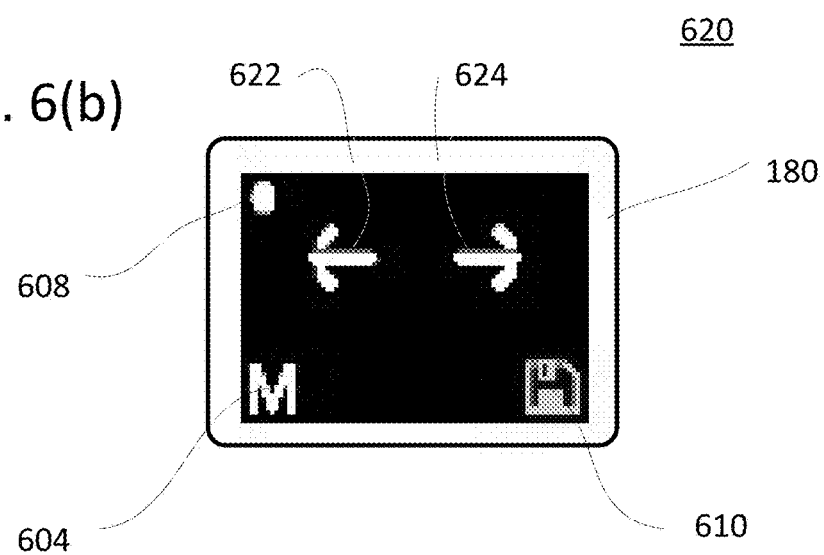

FIG. 6(a) and FIG. 6(b) illustrate two embodiments of a visual display for the espresso machine of the present invention.

Figure 7:
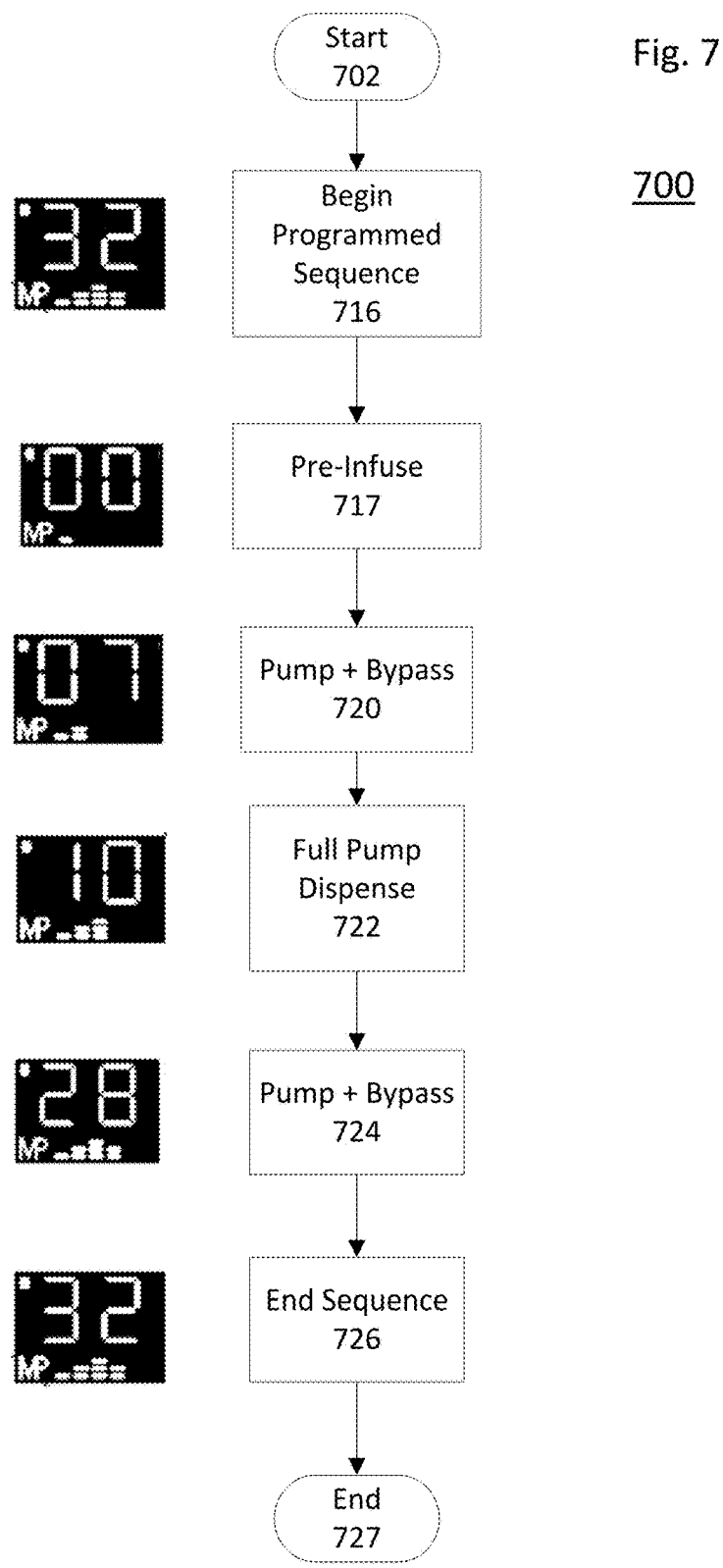

FIG. 7 illustrates a brewing sequence for the espresso machine.

Figure 8:
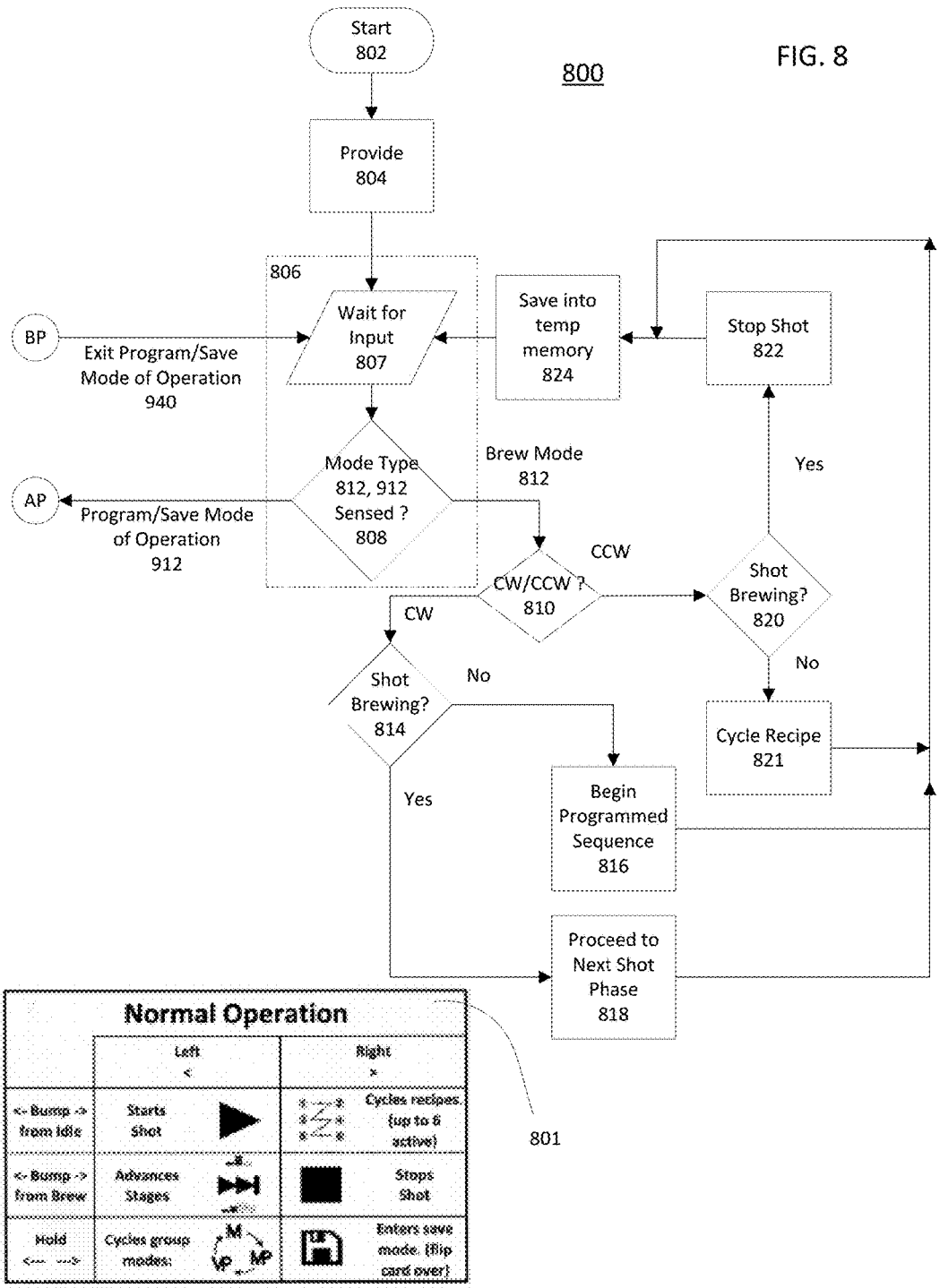

FIG. 8 illustrates an embodiment of an inventive method for operating the espresso machine of the present invention.

Figure 9:
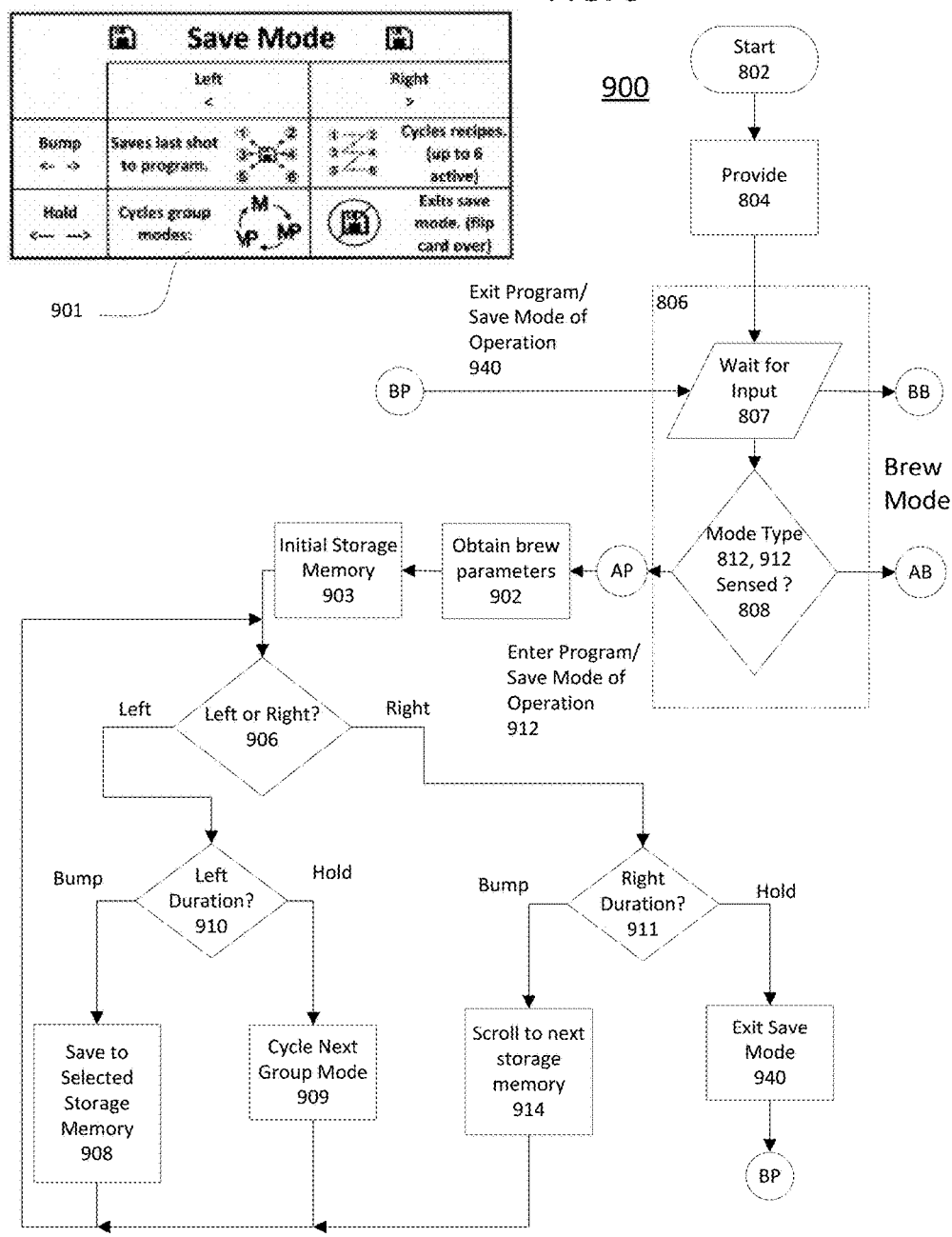

FIG. 9 illustrates a flow chart method for saving and retrieving a set of brew parameters in the espresso machine.

Figure 10:
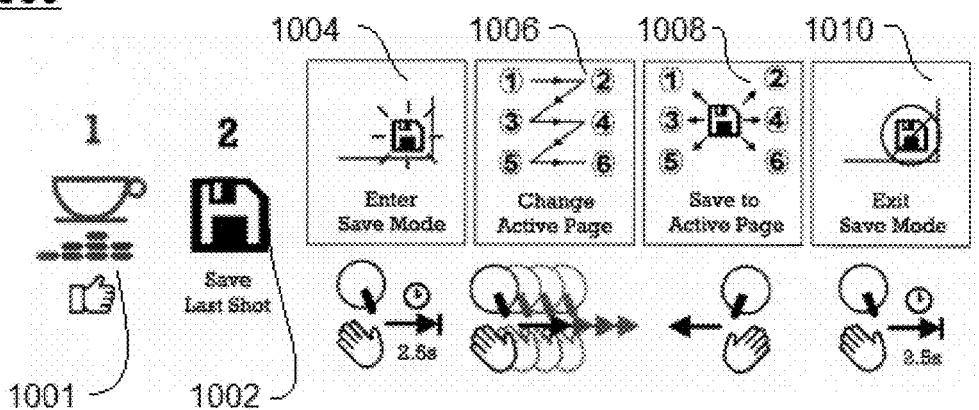
Figure 11A:
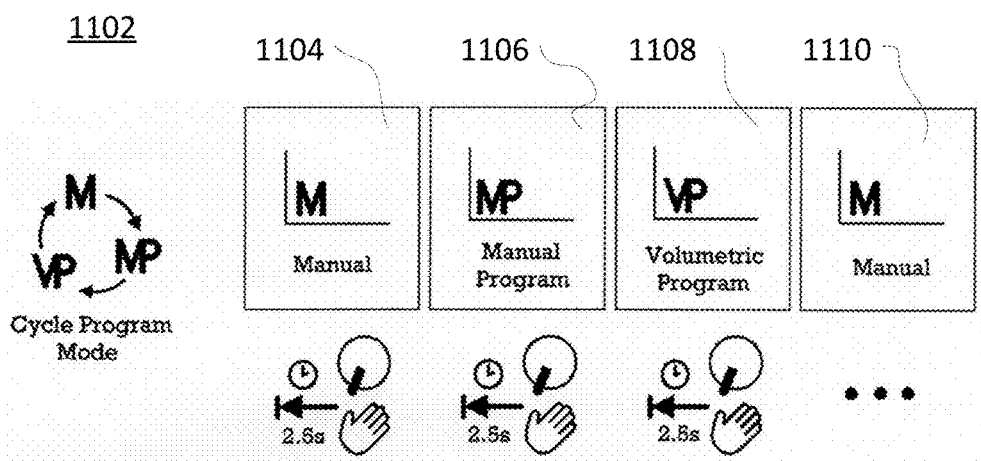
Figure 11B:
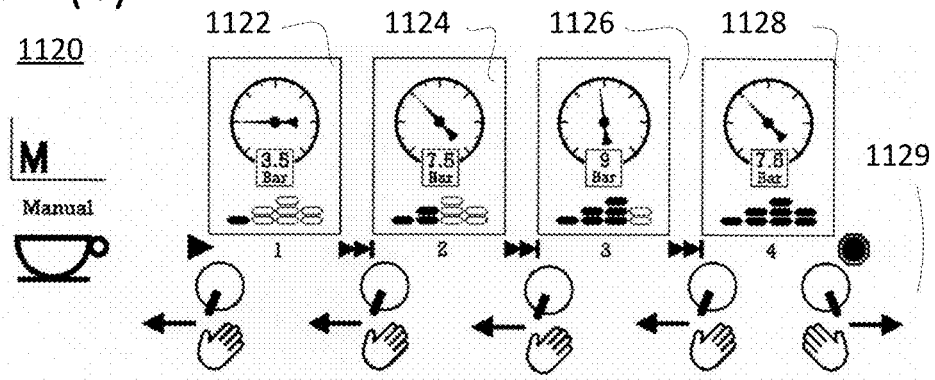
Figure 11C:
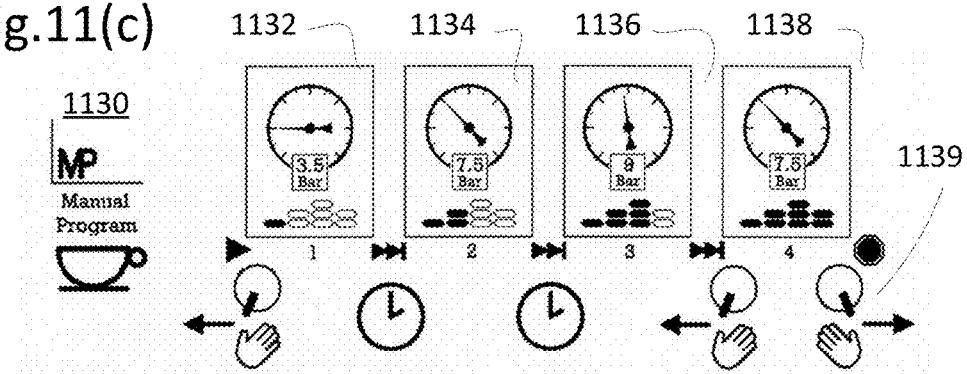
Figure 11D:
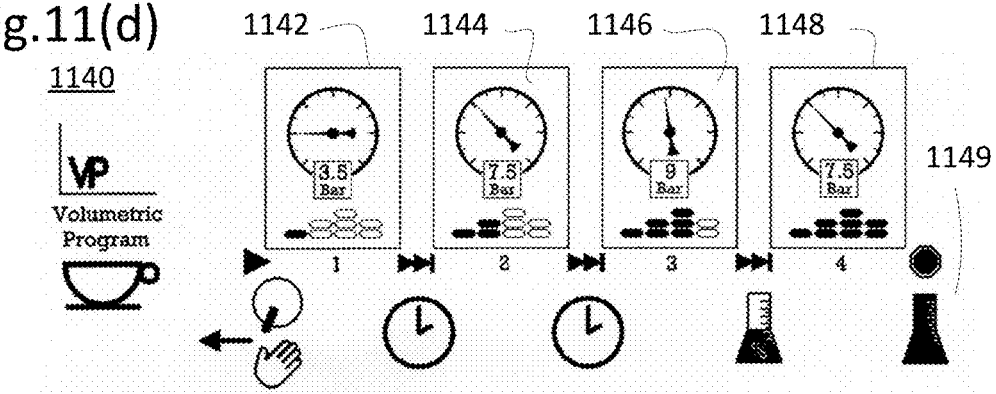

FIG. 10 is a state machine diagram for a simplified method of saving a set of brew parameters to the espresso machine.

FIGS. 11(a), 11(b), 11(c), and 11(d) illustrate a set of state machine diagrams for a various operating modes of the espresso machine.

Figure 12:
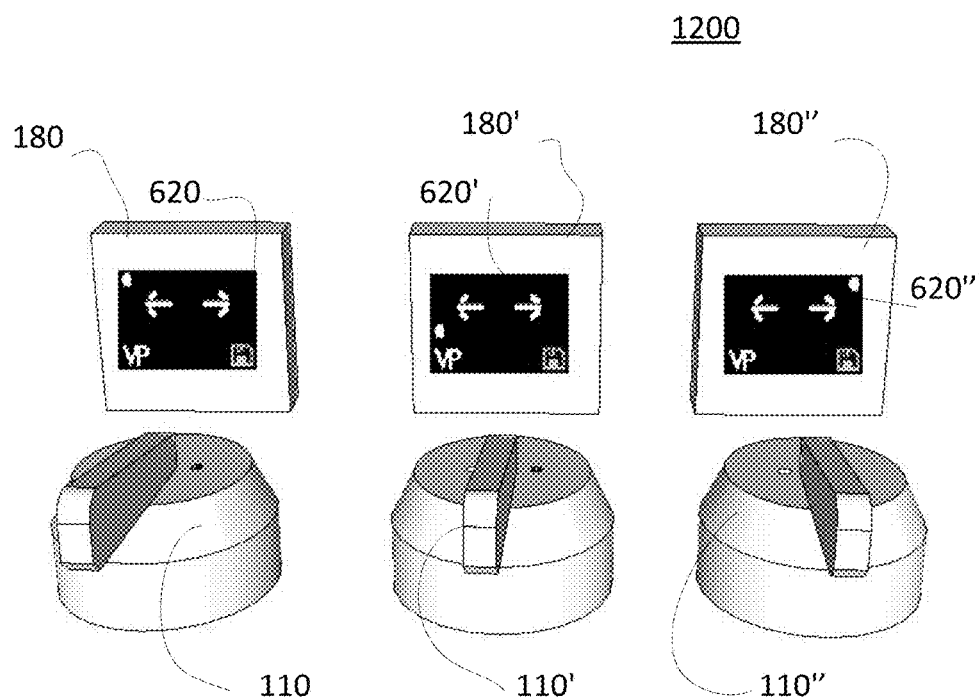

FIG. 12 illustrates a visual display for saving a set of brew parameters from one dosing unit to other dosing units in the espresso machine.

Figure 13:
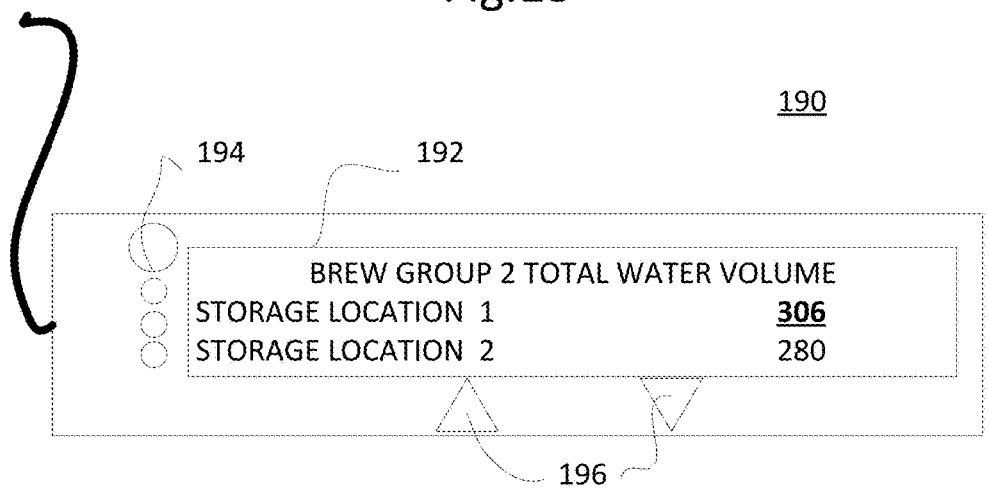

FIG. 13 illustrates a more detailed view of an external programming controller for the espresso machine.

DETAILED DESCRIPTION OF THE PREFERRED EMBODIMENTS

Espresso Machine Including Improved Non-Contact Group Control Head

Figure 1:
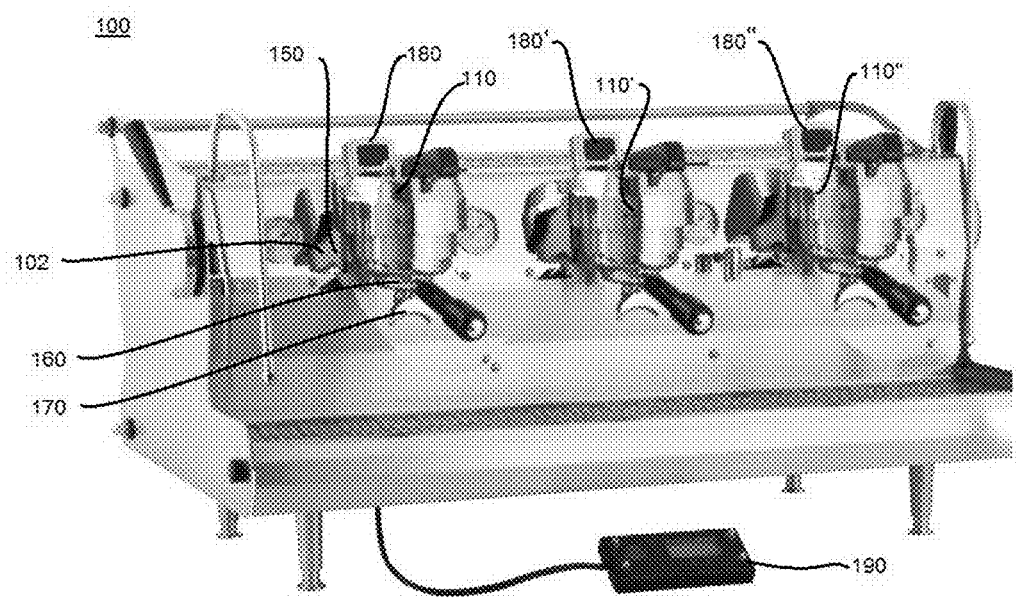
FIG. 1 illustrates an embodiment of an espresso machine according to the present invention.

Now turning to the illustrations, FIG. 1 shows an espresso machine of the present invention. Espresso machine 100 includes an espresso dosing unit 102 having at least one group control head 110 which controls the operation of the machine to provide an espresso dose. Espresso machine 100 includes an internal source of water and steam pressure. Each dose of espresso is dispensed from a brew tank 150 at the outlet of the water source. Brew tank 150 is sized to contain hot water under pressure with enough volume, for example about 1.9 liters, for one or more doses of espresso. Typically, brew tank 150 includes a heating element to maintain the water temperature at an optimal temperature for brewing.

At the outlet of brew tank 150 is a filter 160 for holding ground coffee. Filter 160 is sized to hold enough tamped-in grounds for one dose of espresso. Filter 160 is of course removable so that coffee grounds can be replaced after each use. At the outlet of filter 160 is an outlet spout 170 for guiding the dispensed dose of espresso into a cup, not shown, held or placed below the spout. For the purposes of this description, an espresso dosing unit 102 is generally understood to include at minimum the brew tank 150, filter 160 and outlet spout 170.

Many commercial espresso machines include a visual display 180 disposed on the group control head 110, or on the machine 100 adjacent the dosing unit or group control head. Visual display 180 can display basic shot parameters such as time to completion, dose size, and the like. Because of the need for quick and efficient dosing of espresso shots in commercial settings, it is important that the information provided on visual display 180 is kept as simple, clear and as uncluttered with unneeded data as possible.

It may be noted that the type of grounds placed in the filter 160 may vary. The harvested source and variety of coffee, the texture of the grind, and the age of the coffee grounds affect the taste of the final product in several ways. The coffee variation may affect the tamp of the grounds in the filter 160 and the resulting pressure differential between the brew tank and the spout. The coffee variation also affects the interaction between the grounds and the hot water flowing through them. Each of these factors changes the taste of the dosed espresso. An experienced user desiring to optimize taste needs the ability to vary properties of the brew to account for these variations.

The espresso machine of FIG. 1 also illustrates additional dosing units which include additional group control heads such as second group control head 110' and third group control head 110". The additional dosing units allow for increased throughput of espresso drinks. Each of the additional dosing units may also include dedicated visual displays such as shown in FIG. 1 at second visual display 180' and third visual display 180". The number of dosing units is not important to the invention.

Any of the optional dosing units may be pre-programmed using an optional external programming controller 190. Default brew parameters such dispensing temperature, dose size, and applied pressure profile may be entered via programming controller 190. With reference to FIG. 13, programming controller 190 includes a programmer display 192, which may display text related to a current state of the selected dosing unit or may display text related to a programmed brewing sequence parameter. User selection of the text to be viewed on the controller 190 may be selected via one or more programmer selection buttons 194 disposed next to the corresponding text line, or may be selected via a set of up-and-down programmer scrolling arrows 196. Adjustment of parameters may be entered via the scrolling arrows 196. Other user interfaces such as keyboards, touch pad screens, and the like may be used as well for these functions.

It should be noted that efficient use of controller 190 may entail a more advanced operating skill, and may distract from the ongoing dosing unit operation. Thus, use of programming controller 190 may be generally more desirable during business idle time or downtime.

Figure 2:
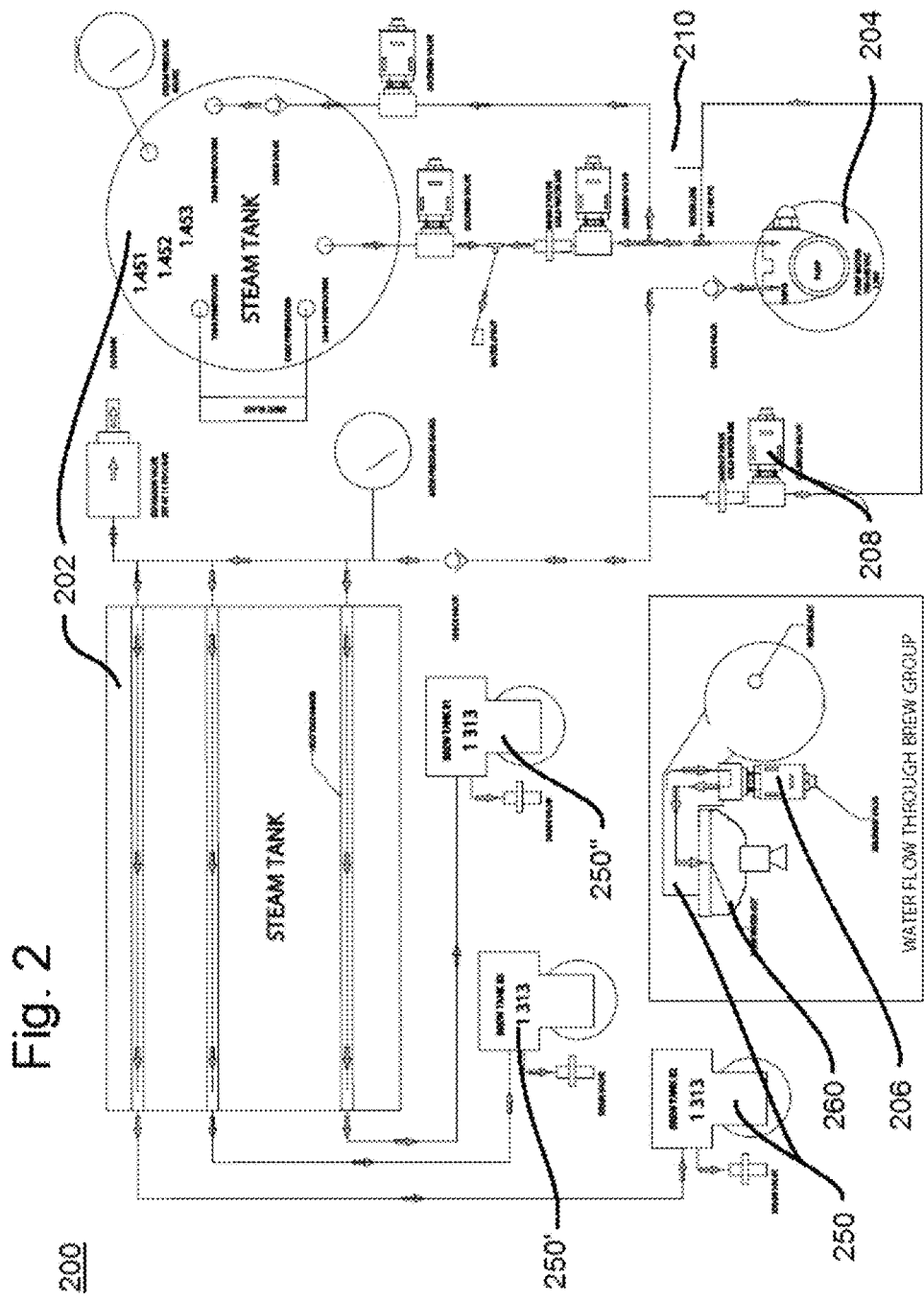
FIG. 2 illustrates the plumbing system of the FIG. 1 espresso machine.

Now referring to FIG. 2, a plumbing arrangement 200 that may be incorporated within the FIG. 1 espresso machine is shown. A single steam tank 202 is generally located within the main housing of the espresso machine, heated to provide a constant temperature and pressure steam source that is commonly used for foaming milk and the like. An external water source 210, such as from building plumbing, and associated valve arrangement provides fill water for the steam tank 202. The water source 210 is also used by a pump 204 as a source of water to brew tank 250 and optional brew tanks 250' and 250". Pump 204 may also operate under computer control to control or vary the pressure in brew tank 250 and consequently the pressure profile across the coffee grounds in the filter 260 as the shot is flowing. An optional bypass control valve 208 and associated plumbing from the pump 204 discharge, i.e. between brew tank 250 and pump, back to the pump 204 suction is also shown. Computer control may operate the optional bypass control valve 208 during the pump operation to establish a time-pressure profile across the filter by diverting the high pressure pump water away from the operating brew group.

As can be seen in FIG. 2, flow of pressurized water from pump 204 to brew tank 250 may pass through the steam tank 202. This feature permits feed water to be pre-heated before entering the brew tank 250, which makes temperature control at the brew group more precise.

Brew tank 250 holds pressurized hot water that is ready for dispensing through the filter 260. Brew tank 250 typically includes a heating element for continued precise temperature control, as well as a temperature sensor and an optional pressure sensor. Brew tank 250 or the dedicated plumbing leading to it may also include a flowmeter.

Control valve 206 starts and stops the pressurized hot water flow from brew tank 250 through filter 260 through the outlet spout 170. In a preferred embodiment, control valve 206 is operated under control of an automated controller, which in turn operates responsive to an actuation signal input from the group control head. Control valve 206 under such control thus provides a controlled volume output of the shot.

If control valve 206 is opened without the pump 204 operating, a reduced flow through the brew tank still occurs. This state is useful at the beginning of a brew to pre-infuse dry coffee grounds with hot water before pumped flow begins. This state may also be useful at the end of the brew to avoid excessive "blonding" of the flow as the grounds are expended. The time between the stopping of the pump and final closing of the control valve establishes a low pressure finish. The value of the low pressure finish may be a percentage of the pumped flow volume to the total flow volume of the brew shot.

FIG. 3 illustrates an exploded diagram of a preferred embodiment of a group control head 300 assembly according to the present invention. The assembly is mounted to the espresso machine 100 via a base 302. Base 302 may be generally cylindrically shaped with a center axis disposed in the vertical plane. Base 302 may optionally be part of brew tank 250, and may include a shroud surrounding the lower vertical portion.

A top plate 324 is disposed on base 302. Top plate 324 comprises a pivot pin 325 centered on the center axis. Pivot pin 325 is arranged to provide a rotational axis for an actuator 340. In addition, a centering post 350 is disposed at a radial idle position on the top plate 324, the post arranged orthogonally from the vertical center axis. Preferably, centering post 350 is disposed near an edge of top plate 324. Centering post 350 is preferably constructed of a ferrous material that is magnetically attractive to a magnet.

Actuator 340 is disposed on top plate 325 at pivot pin 325. Actuator 340 includes a mounting arm, at the end of which a magnet 342 is disposed. The arrangement of actuator 340 on top plate 325 is such that magnet 342 rests adjacent to but not touching center post 350. Actuator 340 is also free to rotate about pivot pin 325 but is held in an idle position 400, FIG. 4, by the magnetic force between magnet and post. This biasing force opposes any rotational force which rotates the actuator 340, and causes the actuator to return to the radial idle position when the rotational force is removed. This holding feature thus serves as an automatic centering feature.

Affixed to top plate 324 is at least one proximity sensor 375 which is operable to sense a position of the magnet 342 with respect to the sensor. Proximity sensor 375 is disposed at a fixed angle away from the radial idle position. When an actuating force rotates the actuator magnet 342 away from the idle position, magnet 342 is positioned near sensor 375. An optional second proximity sensor 376 may be disposed at a second fixed angle from the radial idle position. The second fixed angle may be the opposite angle from the radial idle position. Similarly, when an actuating force rotates the actuator magnet 342 in the opposite direction away from the idle position, magnet 342 is positioned near and is detected by sensor 376.

Proximity sensors 375, 376 are preferably arranged on a proximity sensor board 374 which is held in fixed position above top plate 324 and actuator magnet 342. Magnet 342 is thus free to rotate under the proximity sensor board. In addition, a preferred arrangement is of a single magnet 342 which serves as both an automatic centering magnet and a positioning source to be detected. The arrangement is simpler and requires fewer parts. Of course, the particular arrangement of magnet to sensor(s) may be modified within the scope of the invention.

A preferred type of proximity sensor 375, 376 is a linear type Hall Effect sensor. Such a sensor is commonly understood to provide an analogue output which corresponds to the relative position of a magnet. One advantage of a Hall Effect sensor is that it is non-contact and so has no parts to wear out. The Hall Effect sensor requires minimal periodic adjustment or calibration, and optionally could be used with a comparator to provide a more precise positioning over a large number of cycles.

Importantly, the Hall Effect sensor provides an analogue output that contains more than a simple binary actuation signal or pattern of binary signals. The sensor can provide a signal input to a device controller which is representative of the magnitude of the magnet movement, the velocity of relative movement, and the duration of a held magnet rotation. Thus, the Hall Effect sensor provides the user with a more precise and useful control of the group head.

The user interface portion of the FIG. 3 group control head is a rotational handle 314, which is fixed by screws or other means to actuator 340. The handle 314 may comprise a protective shell which fits over the top plate 324, actuator 340 and the arrangement of sensors 375, 376. A paddle 316 is preferably disposed on handle 314 extending away from the protective shell and in such a manner as to provide easy rotational actuation of the group control head.

In operation, the user experiences a resistive force not unlike a spring force when she rotates the paddle. When the paddle is released, the entire group head control assembly returns to the idle position due to the attraction of magnet and post.

FIGS. 4(a), 4(b) and 4(c) illustrate the operation of the FIG. 3 group control head 300, wherein magnet 342 may be positioned over an arc in proximity to, but not in contact with, at least one proximity sensor. At rest, the group control head is automatically centered and held in the idle position 400 as shown in FIG. 4(a). The magnetic attraction between magnet 342 and post 350 provides the holding force. The output of proximity sensor 375 and/or optional sensor 376 indicates that the magnet 342 is in the idle position 400.

FIG. 4(b) shows the group control head 300 in a brew position 410. Here, the user has rotated paddle 316 in the clockwise, or left, direction such that proximity sensor 375 senses the proximity of magnet 342. The user also experiences a counterclockwise resistive force not unlike a spring force when she rotates the paddle 316, due to the ongoing attraction between displaced magnet 342 and post 350. The attraction repositions the actuator 342 to the idle position 400 when the paddle 316 is released. The effect of the paddle rotation of FIG. 4(b) is to send an input signal corresponding to the sensed magnet position to a controller. The controller in turn may begin a programmed sequence of outputs to the espresso machine to dispense a shot of coffee.

FIG. 4(c) illustrates an optional control position 420 of the group control head 300 corresponding to a counterclockwise, or right, rotation of paddle 316. Second proximity sensor 376 senses the proximity of magnet 342. The user also experiences a clockwise counter-force not unlike a spring force when she rotates the paddle 316, due to the ongoing attraction between displaced magnet 342 and post 350. The attraction repositions the actuator 342 to the idle position 400 when the paddle 316 is released. The effect of the paddle rotation of FIG. 4(c) is to send a second input signal corresponding to the sensed magnet position to a controller. The controller in turn may perform an auxiliary action, such as ending an ongoing shot.

The user of course experiences the above described group control head 300 as having one actuator which has a clockwise, or left, paddle position and a counter-clockwise, or right, paddle position. As will be further described, actuations of short duration and longer duration may provide different responses in the machine control. A short duration actuation may be referred to as a "bump", while longer duration actuations may be referred to as a "hold" or a "long hold." A bump may be, for example, a paddle rotation and release lasting less than 250 milliseconds. An example hold may be from greater than 250 milliseconds up to greater than about 2.5 seconds.

FIG. 5 illustrates a system block diagram of one embodiment of the electrical sensing and control circuit for an espresso machine electrical system 500. The electrical system 500 can be arranged on a single central printed circuit board or may be distributed among several sub-units. For example, FIG. 5 shows one hardware controller 510, but system 500 could equivalently include a separate controller 510 disposed on each group control head in the apparatus. Either the single visual display 520 as shown or a display 520 dedicated to each separate group control head may be used to convey status information. A power supply 540 provides electrical power to the system 500.

The heart of system 500 is controller 510, which can be any of a known CPU or other computer processing unit such as an application specific integrated circuit (ASIC), field programmable gate array (FPGA), or reduced instruction set computing (RISC) type. Controller 510 operates to control the espresso brewing process in response to various inputs. Controller 510 may also operate in accordance with a computer program stored in a computer memory 530. Controller 510 and the computer program then provide a repeatable and coordinated sequence of outputs that generate a controlled dose of espresso. Controller 510 may also be arranged in a programming mode to accept programming instructions from external programming controller 190 and to store those instructions in memory 530 for later use. Similarly, controller 510 may provide a program control data set point or parameter from a user interface to memory 530. Controller 510 may also provide output to a visual display 520 that is located near the respective group control head such that important operating status information can be seen at a glance.

Also shown in FIG. 5 is that memory 530 is preferably apportioned into several parts. A first part is the computer temporary brew memory 532, which as will be described saves parameters related to the current brewing process. The temporary brew memory essentially contains a set of brewing parameters established at the last brew. For example, if the user shortens a pre-infusion period by actuating the group control head handle, that new pre-infusion duration is captured in the temporary brew memory. Each dosing unit has its own temporary brew memory.

Another part of memory 530 comprises a computer storage memory 534 for storing previously saved complete sets of brewing parameters. The portions may be arranged in pages, with a left portion and a right portion for each page. In one embodiment, each dosing unit is provided with from one to three pages. More preferably, computer storage memory 534 comprises at least two storage locations, without any paging arrangement. Shown in FIG. 5 is an exemplary embodiment of storage memory 534 having six storage locations 541 through 546. Each portion or storage location is sized to contain one set of brewing parameters. Each dosing unit has its own computer storage memory 534.

Outputs from each group head are provided as inputs to controller 510. Examples of inputs are a group head water flow meter 502 and a brew tank temperature sensor 504. Controller 510 may use these inputs to start or stop the brew program or to otherwise control various heating and pumping components. Controller 510 preferably operates under the further control of an internal clock or timer to shift between various phases of the brew process.

Controller 510 also accepts signal inputs from each respective group control head 300 via proximity sensor outputs 375, 376. The accepted signal inputs control the program sequence that provides the espresso dose. An example is a received input from non-contact proximity sensor 375 that corresponds to a single actuation of the group control head handle. Controller 510 then issues a coordinated program sequence of output instructions to provide the dose. The outputs can be one or more of a pump control output 522, a control valve control output 524, and a bypass valve output 526.

A second input control example is a received signal input from the second non-contact proximity sensor 376 that corresponds to a different single actuation of the group control head handle. Controller 510 responsively issues an output to one or more of a pump control output 522, a control valve control output 524, and a bypass valve output 526 to, for example, immediately end the controlled dose.

FIG. 6(a) and FIG. 6(b) illustrate two embodiments of the information provided on the optional visual display 180 for the espresso machine of the present invention. The displayed information provides the user with the current status of the machine and group control head guidance instructions with simple indications.

FIG. 6(a) shows an operational display 600 provided during normal operation or during a programmed brewing sequence. The most prominent feature of this display is a shot timer 602. Shot timer 602 will typically display the total duration of the shot, e.g. 32 seconds, during idle times between brews. During the brew sequence, shot timer 602 preferably displays the elapsed time from the start of the shot, although similar indications of shot progression such as count-down time or time from the start of a particular sequence phase are included within the scope of this invention.

Mode icon 604 shows the espresso machine mode of operation, which may include a manual mode, a manual program or a volumetric program mode. Here shown on icon 604 is the volumetric program mode icon VP. An espresso machine operating in volumetric program mode is typically controlled on a flow basis as sensed by the flow meter. An espresso machine operating in manual program mode MP is typically controlled by the sequence timer with some control by the user. Manual mode M is typically a mode of operation under full control by the user.

Phase icon 606 indicates a relative duration of each phase of the brewing sequence. The phases will be described in more detail with reference to FIG. 7. The embodiment shown uses simple bar graphs to display the relative length of each of three phases.

Memory storage location icon 608 shows the memory portion of computer storage memory 534 that is currently selected for use. Here, icon 608 is a dot which points to a first memory storage location. Additional storage location icons, if available, may be arrayed below icon 608 or along the right border of display 600. If the storage memory location is ready to receive data, a save icon 610 is shown.

FIG. 6(b) shows a save mode display 620 that is shown during the transfer of brew parameters between the temporary memory and/or storage memory locations. When in save mode, and when the storage memory location is ready to receive data, one display embodiment incorporates a save left icon 622 and a storage memory cycling icon 624 guides the user to save the current data via a left bump and to select the storage memory for saving by cycling through the locations with one or more right bumps of the group control head respectively. In this case, the "M" mode icon 604 indicates that the saving is being performed from a manual mode of operation.

FIG. 7 illustrates a brewing sequence 700 for the espresso machine. From an idle state, the sequence is started at start step 702 by the user operating the group control head paddle or by pushing a button. The controller 510 initiates the programmed sequence at step 716 using the currently-selected set of brew parameters and also begins to save brewing data into the temporary memory 532.

The brewing phases then begin at a pre-infusion brew phase 717. During this phase, controller 510 opens the dosing unit control valve 524, 206 to pre-infuse the dry coffee grounds with unpressurized water from the brew tank 250. This phase typically begins in response to the same first input signal received from the user at the start step 702.

At the end of the pre-infusion phase, an optional pressure ramp up phase 720 begins. The transition from pre-infusion to pressure ramp up may be in response to a programmed sequence time or to a user input from the group control head paddle. Pressure ramp up phase 720 starts the pump 204 and optionally opens the bypass control valve 208 to gradually pressurize the brew tank 250 to drive water through the grounds.

In response to a programmed sequence time or to a user input from the group control head paddle, a full pressure brew phase 720 begins. During this phase, the bypass control valve is closed and the pump is running to provide maximum shot flow through the grounds.

Depending on the particular grounds in use, an undesirable "blonding" of the flow may occur as the grounds are used up during the full pressure brew phase 720. To avoid the effects of blonding, the sequence may then transition to an optional pressure ramp down phase 724. Like ramp up phase 720, the pump is running and the bypass control valve is opened to gradually reduce pressure on the grounds. The beginning of this phase may occur in response to a programmed sequence time or to a user input from the group control head paddle.

A stop shot phase 726 ends the brewing sequence. This phase typically functions to ensure that the precise shot volume is dispensed. Here, the pump is not running but the control valve is still open. The transition into the stop shot phase 726 may be in response to a programmed sequence time or to a user input from the group control head paddle. Similarly, the stop shot phase is ended by closing control valve 524, 206 when the full dose has been dispensed as sensed by elapsed time, flow meter volume, or by user input. The machine then re-enters an idle mode at end step 727.

Shown next to each phase of the sequence is an exemplary operational display 600 on visual display 180. Shown is the total time of the sequence at the beginning and end as well as the elapsed time during the sequence. Also shown is the Manual Programming MP operating mode and the stored parameter set that is in use. Optionally, display 180 may show a volume dispensed instead of an elapsed time during the brewing phases.

The above described sequence is driven by a set of parameters or settings which control each phase. For example, the set of parameters may include a pre-infusion time, a low pressure ramp up time, a full pump dispense time, a ramp down time, and a total dose water volume dispensed. Generally, a set can be defined with four parameters. End step 726, for example, can be defined with the low pressure finish percent, which may be a percent of overall shot time or overall shot volume.

Method and Apparatus for Optimizing a Set of Brew Parameters

FIG. 8 illustrates a flow chart for an inventive method of operating the espresso machine of the present invention, and in particular a method 800 for optimizing and storing the conditions for a controlled dose of hot water dispensed from the machine. The method then saves the optimized set of brew parameters for a subsequent use of the espresso machine. Method 800 begins at start step 802. The method then proceeds to a step 804 of providing the espresso machine apparatus as previously described, including the dosing unit, the group control head 110, 300, the pump 204, the temporary brew memory, and the controller. Providing step 804 may also include the steps of activating the apparatus, initiating the program stored in memory, preheating and pre-pressurizing the system, and/or preparing and installing the grounds filter. After completion of providing step 804, the espresso machine is ready to dispense espresso, and begins to monitor at the group control head proximity sensor 375, 376 inputs.

Step 806 is for monitoring and sensing a momentary actuation or bump of the group control head handle to a particular angular brew position. Step 806 pauses at monitoring sub-step 807 until controller 510 senses an actuation. When an actuation is sensed, another sub-step, mode decision step 808 determines the type of actuation and continues the method accordingly. For example, a sensed bump actuation may send the method into the brew mode 812, and a long duration actuation may send the method into a programming or saving mode of operation 912. The saving mode of operation, and its return to the monitoring step 806 will be described in more detail.

An actuation direction decision step 810 immediately follows step 808. The direction of actuation, clockwise/left (CW) or counter-clockwise/right (CCW), may cause the method 800 to respond differently depending on whether a shot is brewing at the time of actuation or not, i.e. in an idle state. If no shot is brewing at actuation, as sensed by the controller at shot brewing decision steps 814 and 820, the direction may determine which of two sets of parameters is used for the subsequent shot, i.e. the set stored in the current computer temporary brew memory or a different set stored in the computer storage memory respective to the CW left or CCW right bump. In a preferred embodiment, a sensed CCW right bump with no shot brewing causes the controller to retrieve the set of brew parameters stored at the next sequential memory storage location 541-546 for that group head at cycling step 821. That set is placed into the temporary brew memory at step 824. If the CCW right bump is repeated, the brew parameters at the next sequential memory storage location 541-546 is retrieved into temporary memory at 821, and so on. Thus, the operator experiences a cycling of stored recipes on that group head.

If a CW left bump is sensed while in the idle state, method 800 proceeds to begin the programmed sequence at step 816 according to the selected set of parameters stored from step 824 in the temporary computer brew memory. The programmed brew sequence then begins as described in FIG. 7 with the pre-infusion step 717 of opening the control valve to begin the controlled dose of hot water. Step 816 also initiates a saving into the computer temporary memory of subsequent actuation steps. Then the method 800 returns to the sensing/monitoring step 806 to await the next sensed actuation of the group control head paddle.

If no further actuations occur, the programmed sequence of FIG. 7 automatically completes itself and delivers a controlled dose in accordance with the selected set of parameters. The set of parameters saved to the temporary brew memory would in this case be identical to the selected set.

If the selected set of parameters is set to a null manual MAN setting or the mode of operation is in the Manual mode, the method 800 may continue in a completely manual sequence. The sequence still follows the FIG. 7 sequence, but the transition between each phase occurs at an actuation sensing and never at an elapsed time. In an example manual mode operation, the first momentary action of the group control head handle begins the pre-infusion step whereby the control valve is opened and the parameter saving is initiated. The controller would respond to subsequent CW momentary actuations of the handle by repeatedly proceeding along the cycle of step 808, step 810, step 814, a proceed to next shot phase 818, and a return to step 806. Thus, the full pressure phase, and/or the optional pressure ramp up or ramp down phase is controlled by the repeated sensed CW actuations at next shot phase 818. These phases involve starting and running the pump to provide the controlled dose of hot water through the dosing unit. At each phase transition, a parameter related to the duration of each phase is saved into the computer temporary memory at saving step 824.

In one embodiment of the completely manual mode, the third actuation of the proceed to next shot phase 818 stops the pump to end the controlled dose of hot water. Optionally, a fourth actuation of the next shot phase 818 closes the control valve at the proper shot dose volume corresponding to end sequence step 726. The duration of each of these phases is saved into the temporary memory at saving step 824. The overall saving of these steps thus creates a complete set of brew parameters in memory. The saved set of brew parameters may be used in subsequent programmed brew sequences.

As can be seen in FIG. 8, a CCW bump of the group control head handle sensed at step 810 while the shot is brewing as sensed at step 820 always causes the method to immediately proceed to stop shot step 822. This step 822 stops the pump and closes the control valve to end any further flow through the dosing unit. A user may also perform this actuation if, for example, when the desired brew volume has already been reached but the flow is continuing under the ongoing programmed sequence.

FIG. 8 also illustrates how the method 800 may be used to dynamically adjust, while operating in the automatic programmed brew sequence mode, a set of parameters that have already been saved in memory. In this situation, the espresso machine is prepared to dispense the next dose using a previously saved set of parameters. When the momentary actuation is repeated and sensed at step 806, the control valve is re-opened and the controller newly initiates the saving of parameters into the temporary memory. The new programmed brew sequence begins again. If no further actuations are sensed during the brew, then the programmed brew sequence automatically controls the control valve and pump to replicate the previous controlled dose of hot water.

But if the user desires to adjust, i.e. shorten, one or more of the sequence phases, then she merely again bumps the paddle CW to truncate that phase and immediately start the next phase at step 818. This action may, for example be a repeat of the third momentary actuation step, which stops the pump and therefore stops the replication. The phase duration as defined by the actuation is saved into the temporary memory as part of a new, i.e. second, set of brew parameters. In one embodiment the saving at step 824 further comprises the step of overwriting the previous set of brew parameters with the second set of parameters in the temporary memory. This second set can then be used for subsequent brews. In a preferred embodiment, adjustment of every brew phase is enabled for Manual mode of operation, and a limited adjustment of only the low pressure finish phase, step 724 of FIG. 7, is enabled during Manual Program mode of operation.

A summary of the FIG. 8 operation is illustrated in state table 801. There shown is the response in the espresso machine corresponding to each particular operation of the group head control handle during the normal, or brew mode of operation.

The espresso machine apparatus that is previously described may be modified to use the method 800 for storing and adjusting the dosing conditions. In addition, the machine may optionally comprise visual display 180, which displays the phase of the sequence as the sequence proceeds. After the sequence is complete, the visual display 180 may display an indication that the phases have been saved as a new set of parameters.

EXAMPLE

The barista prepares the espresso dosing unit and refreshes the grounds in the filter. She decides to manually brew a shot. The barista bumps the group control head paddle to the left to begin pre-infusion and watches for the first drips to pass the filter basket. Once the basket is saturated, she bumps the paddle left again to add pump pressure. The shot speed begins to increase and the color of the flow begins to lighten toward the end of the shot. She bumps the paddle left again to return to line pressure, then bumps it right to end the shot.

Example parameters saved into temporary memory for this manual shot are 6.2 seconds pre-infusion and 60 milliliters water volume with a 97% low pressure finish. This set of parameters is now available to save for future replication.

Of course, if the sequence is not progressing satisfactorily, a bump of the paddle to the right while the shot is in progress immediately ends the shot.

Method and Apparatus for Saving an Optimized Set of Brew Parameters

FIG. 9 continues the FIG. 8 method flow, further describing a method 900 for storing brewing parameters in an espresso machine. The method starts when the first sensed actuation of the group control head handle at step 806 enters the machine into a program and save mode of operation 912. This path is shown by the indicator AP. An example first actuation is a long hold, e.g. greater than 250 milliseconds, to enter this mode.

Responsive to entering the program and save mode of operation 912, the current set of brew or shot parameters is obtained from the computer temporary brew memory at step 902. The visual display 180 corresponding to the dosing unit may begin to flash the save icon 610 at this time to indicate the saving/programming mode of operation. One object of this invention is that this current set of shot parameters can then be assigned to as many computer storage memory locations on as many different group control heads in the system as desired. In addition, the visual display 180 may also begin to indicate the current set of brew parameters. Of course, if the operator desires to store a set of brew parameters that is not currently in the computer temporary brew memory, she may transfer the desired set of parameters from a computer storage location to the temporary brew memory prior to the obtaining step above. Preferably, this is done by selecting the computer storage location with the desired parameters with one or more right bumps from idle, step 821, and then running that shot with a left bump, step 816 shown in FIG. 8.

Also responsive to entering the program and save mode of operation 912 at the first sensed actuation, the controller selects a default or initial computer storage memory location at initial storage memory step 903. This default computer storage location may be pre-selected to appear each time the save mode is entered, or may simply be the last storage memory location used. If the espresso machine has multiple dosing units, the controller may select a default memory location at each group control head. Preferably, the visual display(s) 180 displays the active computer storage memory location at this step. The group control head of the first sensed actuation may optionally display brew parameters from the set in the temporary brew memory or the computer storage memory at the obtaining step.

Method for Storing Brewing Parameters, Single Dosing Unit

After entering the save mode of operation 912, the method proceeds to the step of saving the set of parameters from the last shot brewed, i.e. the parameters in the computer temporary brew memory, into a computer storage memory location. In one simple embodiment, the operator merely bumps the group control head handle to the left, sensed as a second actuation by the controller. The method flow shows the bump sensed as a left actuation at direction step 906 and as a bump at duration step 910. The left bump causes the controller to save the set of brew parameters into the default or initial storage memory from step 903.

The operator may wish to save the set of brew parameters into a different computer storage memory location than the default location. The operator selects a different location by scrolling through the available locations with one or more right bumps of the group control head handle. The controller senses the input at direction step 906 and duration step 911 to scroll to the next available storage memory at step 914. Step 914 preferably includes the display of the computer storage memory location on visual display 180, as exemplified in FIG. 6(*b*). A subsequent left bump, steps 906, 910 saves the set of parameters to the selected location at step 908. It is preferable that the bumps for scrolling and saving are in opposite directions of the handle, but the particular directions described above may be swapped within the scope of the invention.

The operator exits the save mode of operation at step 940 and returns to the brew mode of operation. The controller may exit the save mode in several ways, e.g. by a time-out or immediately upon the saving step. Preferably, an affirmative actuation triggers the exit, such as a group head control handle "right hold" actuation, as shown by the path of direction step 906 and as a hold at duration step 911.

An additional function may be provided while in the save mode of operation. The controller may cycle to another of a group mode at cycle mode step 909, e.g. Manual Mode or Manual Program Mode or Volumetric Program Mode, responsive to a sensed left hold from the group control head handle via direction step 906 and duration step 910. When a set of parameters is subsequently saved, the set will correspond to that particular group mode.

A summary of the FIG. 9 operation is illustrated in state table 901. There shown is the response in the espresso machine corresponding to each particular operation of the group head control handle during the program and save mode of operation.

Transferring a Set of Brew Parameters Between Espresso Dosing Units

If the espresso machine is a multi-head device having a plurality of previously described espresso dosing units, the machine may be arranged to transfer a desired set of brewing parameters from one of the dosing units to another. In this embodiment, a controller 510 is in communication with all of the group control heads, temporary memories, and storage memories. A visual display is optionally associated with each dosing unit.

The system is arranged such that when a program and save mode of operation is entered at any of the dosing units, for example by the method flow chart of FIG. 9, controller 510 activates all of the dosing units for saving.

FIG. 12 illustrates one embodiment of the group display 1200. After entering the save mode 900 and obtaining the desired set of brew parameters with one of the group control heads, all of the visual displays 180, 180', 180" will display a save screen 620, 620', 620" and a flashing save icon 610. Any of the other group control heads can be scrolled as described above to select that dosing unit's desired storage location for saving. Then each group control head can separately save the desired set of brew parameters to the selected memory and exit the save mode as described above. Exiting from the save mode alternatively may be accomplished all at once by exiting the save mode, step 940, at the source group control head.

After either of the above described transferring steps, a programmed brew sequence may be initiated at any of the dosing units according to the transferred set of brew parameters. When a subsequent group control handle bump for another of the dosing units is sensed at its step 806, then a new programmed brew sequence is initiated according to the transferred set of parameters. The espresso machine then automatically conducts the programmed sequence at step 812 to dispense the new dose of espresso. Thus the conditions for the desired dose are replicated across the dosing units.

FIG. 10 illustrates example visual display graphics and state machine diagram 1000 that accompany the program and save mode of operation. Prior to entering the save mode, the espresso machine is in the brew mode of operation 1001, and typically runs a shot to automatically save the last shot into the computer temporary brew memory at step 1002. The operator then performs a right hold, e.g. for 2.5 seconds, at enter save mode step 1004, whereupon the visual display 180 begins to flash the save icon. The operator then optionally bumps right one or more times at step 1006 to change the desired computer storage memory location for saving. When the desired location is selected, the operator bumps left at save step 1008 to save the shot parameters to the location. The operator then exits the save mode at step 1010 with a right hold, e.g. for 2.5 seconds.

After the save mode of operation ends at exit step 940, the espresso machine is then ready to enter the brew mode again with the newly saved and selected set of brew parameters. If a different set of brew parameters is desired, the operator simply bumps right one or more times to cycle through the recipes, and stops when the desired recipe is reached. When a subsequent group control handle bump is sensed at step 806, then the new programmed brew sequence is initiated according to this new second set of parameters. The espresso machine then automatically conducts the programmed sequence at step 812 to dispense the new dose of espresso.

FIGS. 11(*a*) through 11(*d*) illustrate an additional series of state machine diagrams for the operation of the espresso machine. FIG. 11(*a*) illustrates program mode adjustment state machine 1102. When the controller senses a left hold, e.g. 2.5 seconds, on a group control head handle, the controller enters the cycle program mode. Subsequent left holds cause the controller to cycle its program mode through the available programs, here shown the modes Manual 1104, Manual Program 1106, Volumetric Program 1108, and cycle back to Manual 1110. Further detail about operating in these modes is shown in FIG. 11(*b*)-(*d*).

FIG. 11(*b*) illustrates one exemplary operation of the Manual Mode 1120, a mode that allows the operator complete control of the shot parameters. Starting from an idle state at steps 802, 804, the operator bumps left to start the shot by pre-infusion at start step 1122. The controller begins the pre-infusion operation, and awaits subsequent bumps left before advancing the shot to the next phases of pressure ramp-up step 1124, full pressure brew step 1126, and pressure ramp-down step 1128 respectively. The shot is stopped at step 1129 at a sensed bump right. The brew parameters are retained within the computer temporary brew memory. Visual display 180 may display the current phase and parameters during the shot.

FIG. 11(*c*) illustrates one exemplary operation of the Manual Program Mode 1130, a mode that allows the operator limited control of the shot parameters. Starting from an idle state at steps 802, 804, the operator bumps left to start the shot by pre-infusion at start step 1132. The controller automatically advances the shot to the next phases of pressure ramp-up step 1134, full pressure brew step 1136, and pressure ramp-down step 1138. The shot is stopped at step 1139 at a sensed bump right. The operator may adjust the "blonding" of the shot at step 1136 with a left bump to truncate the shot pressure, and then may end the shot at the desired volume (if necessary) with a right bump at stop step 1139. Visual display 180 may display the current phase and parameters during the shot.

FIG. 11(*d*) illustrates one exemplary operation of the Volumetric Program Mode 1140, a mode that allows the operator control of the start of the shot only. Starting from an idle state at steps 802, 804, the operator bumps left to start the shot by pre-infusion at start step 1142. The controller then automatically advances the shot to each next phase at pressure ramp-up step 1144, full pressure brew step 1146, and pressure ramp-down step 1148 according to the program brew parameters in use. The shot is automatically stopped at step 1149 upon reaching the pre-programmed volume as sensed by the flowmeter. In this program mode, the operator may truncate the shot at any time with a bump right. The visual display 180 may display the current phase and parameters during the shot.

The functionality of the various program modes corresponds to the method flow steps as shown in FIG. 8. For example, a sensed CCW actuation at step 810 with a shot brewing at step 820 which immediately ends the shot at step 822. This corresponds to the right bumps at FIG. 11 steps 1129 and 1139.

When the paddle is released, the save mode of operation then exits at exit step 940. The espresso machine is then ready to enter the brew mode again with the newly saved and selected set of brew parameters. When a subsequent group control handle bump is sensed at step 806, then a new programmed brew sequence is initiated according to this new second set of parameters. The espresso machine then automatically conducts the programmed sequence starting at step 812 to dispense the new dose of espresso.

Retrieving a Stored Set of Parameters for Use

FIG. 8 at state machine table 801 also illustrates a method for obtaining from storage memory a set of parameters for use, where the set of parameters has been previously stored in one of the page portions instead of the temporary brew memory. This functionality is enabled simply by cycling through the memory storage locations by means of scrolling with the group control head handle. In the FIG. 9 embodiment, the group control head handle is bumped right one or more times to cycle through the storage locations, up to six. When cycled, visual display 180 preferably highlights the particular location. A subsequent bump to the opposite left side then starts the shot using that selected recipe. The shot parameters are also transferred to the temporary brew memory during the shot, for subsequent saving and use.

EXAMPLE

Some example settings for a page in computer storage memory appear in Table 1 below:

| Brew Group 2 (Volumetric Mode) | |
|---|---|
| | Program 1 |
| Pre-infuse | 4.0 |
| Ramp Up | 1.8 |
| % of Shot Brewed | 91% |
| Total Water Volume | 350 |

A note from the morning barista says that they made a great shot earlier in the day and saved it in Brew Group 2 Program 1. We are currently using Program 2 on the second group, so the first step is to cycle to the Program 1 by bumping the group head control handle five times until Program 1 is highlighted on visual display 180'. Then we prepare a filter puck and bump left. The programmed sequence will run through 4 seconds of pre-infusion, ramp up for 1.8 seconds, and then run the pump until 91% of the total flow meter count of 350, corresponding to about 60 ml of water, has been dispensed. The pump will then shut off and the shot will finish at line pressure.

An espresso machine apparatus as described in FIGS. 1 through 6 comprises each of the elements that are necessary to perform the methods described above. An optional external programming controller 190, described in FIG. 13 may be used in concert with the group control heads, controller, memories, and programmed sequences for additional flexibility in programming.

FIG. 13 shows an embodiment of the optional external programming controller 190 that may be used with the inventive espresso machine. Controller 190 is preferably handheld and communicatively connected to the controller 510 by wired or wireless means. Controller 190 includes three main features. Programmer display 192 displays information related to the stored programs. Programmer selection buttons 194 are arranged next to the display to enable the user to select particular items in display 192. Programmer scrolling arrows 196 enable the user to adjust values of the displayed items.

If no useful set of brewing parameters yet exists in computer storage memory, or if it is desired to enter the values without brewing, one or more of the parameter set values may be more easily entered via the controller 190. For example, the user wishes to adjust the volume of the shot on number 2 brew group, i.e. dosing unit. She scrolls with the scrolling arrows 196 until Brew Group 2 is displayed. The desired set of brew parameters resides in the memory storage location 1, so she presses the button 194 that is adjacent that label. Then she presses the scrolling arrows to adjust the volume to the desired amount. Another press of the button 194 deselects the line and updates the set of brew parameters at that memory location. As previously described, this new set of brew parameters can be saved to any of the other memory locations in any of the other brew groups, and can be used with the group control head controls during the next brew. The entry of data using programmer 190 may also be conducted in concert with selection and saving of that data via the group control head operations as described above.

Modifications to the device, method, and displays as described above are encompassed within the scope of the invention. For example, various configurations of the plumbing and electrical systems which fulfill the objectives of the described invention fall within the scope of the claims. Also, the particular appearance and arrangement of the apparatus may differ.

| Table of Elements | |
|---|---|
| Number | Name |
| 100 | Espresso machine |
| 102 | Espresso dosing unit |
| 110 | Group control head |
| 110' | Second group control head |
| 110" | Third group control head |
| 150 | Brew tank |
| 160 | Filter |
| 170 | Outlet spout |
| 180 | Visual display |
| 180' | Second visual display |
| 180" | Third visual display |
| 190 | External programming controller |
| 192 | Programmer display |
| 194 | Programmer selection buttons |
| 196 | Programmer scrolling arrows |
| 200 | Espresso machine |
| 202 | Steam tank |
| 204 | Pump |
| 206 | Control valve |
| 208 | Bypass control valve |
| 210 | Water source |
| 250 | Brew tank |
| 250' | Second brew tank |
| 250" | Third brew tank |
| 260 | Filter |
| 300 | Group control head |
| 302 | Base |
| 314 | Handle |
| 316 | paddle |
| 324 | Top plate |
| 325 | Pivot pin |
| 340 | Actuator |
| 342 | Magnet |
| 350 | Centering post |
| 374 | Proximity sensor board |
| 375 | First proximity sensor |
| 376 | Second proximity sensor |
| 400 | Idle position |
| 410 | Brew position |
| 420 | Control position |
| 500 | Espresso machine electrical system |
| 502 | Group head flow meter |

-continued

Table of Elements

| Number | Name |
|---|---|
| 504 | Brew tank temperature sensor |
| 510 | Controller |
| 520 | Visual display |
| 522 | Pump control output |
| 524 | Control valve control output |
| 526 | Bypass valve output |
| 530 | Computer memory |
| 532 | Computer temporary brew memory |
| 534 | Computer storage memory |
| | Computer storage memory page |
| | Page left portion |
| | Page right portion |
| 540 | Power supply |
| 541-546 | Computer storage memory storage locations |
| 600 | Operational display of programmed sequence |
| 602 | Shot timer display |
| 604 | Mode icon |
| 606 | Brew sequence phase display |
| 608 | Memory storage location icon |
| 610 | Save icon |
| 620 | Save mode display of brew parameter set transfer |
| 620' | Second save mode display (not used) |
| 620" | Third save mode display (not used) |
| 622 | Save left icon |
| 624 | Storage memory cycling icon |
| 700 | Espresso machine brewing sequence |
| 702 | Brewing start step |
| 716 | Brewing initiation step |
| 717 | Pre-infusion brew phase |
| 720 | Pressure ramp up phase |
| 722 | Full pressure brew phase |
| 724 | Pressure ramp down phase |
| 726 | Stop shot phase |
| 727 | End step |
| 800 | Method for providing hot water dose |
| 802 | Method start step |
| 804 | Providing an espresso machine step |
| 806 | sensing step |
| 807 | Monitoring step |
| 808 | mode decision step |
| 810 | actuation direction decision step |
| 812 | brew mode |
| 814 | shot brewing decision step |
| 816 | begin programmed sequence step |
| 818 | Proceed to next phase in sequence step |
| 820 | shot brewing decision step |
| 821 | Cycle recipe step |
| 822 | stop shot step |
| 824 | save into temporary memory step |
| 900 | Method for storing brewing parameters in an espresso machine |
| 901 | Saving method state table |
| 902 | Obtain brew parameters step |
| 903 | initial computer storage memory location step |
| 906 | Sense actuator direction step |
| 908 | Save to selected storage memory step |
| 909 | Group mode cycling step |
| 910 | Duration step |
| 911 | Duration step |
| 912 | Enter program and save mode of operation |
| 914 | scroll to the next available storage memory at step |
| 940 | Exit from program and save mode of operation |
| 1000 | Visual display state machine diagram, save mode |
| 1001 | Initial brew mode of operation |
| 1002 | Save last shot into computer temporary brew memory step |
| 1004 | enter save mode step |
| 1006 | change computer storage memory location step |
| 1008 | save to active computer storage memory step |
| 1010 | Exit save mode step |
| 1102 | Program mode adjustment state machine |
| 1104 | Manual mode |
| 1106 | Manual program mode |
| 1108 | Volumetric program mode |
| 1110 | Manual mode cycle |
| 1120 | Manual (M) mode of operation |
| 1122 | M start and pre-infusion step |
| 1124 | M pressure ramp-up step |
| 1126 | M full pressure brew step |
| 1128 | M pressure ramp-down step |
| 1129 | M stop step |
| 1130 | Manual Program (MP) mode of operation |
| 1132 | MP start and pre-infusion step |
| 1134 | MP pressure ramp-up step |
| 1136 | MP full pressure brew step |
| 1138 | MP pressure ramp-down step |
| 1139 | MP stop step |
| 1140 | Volumetric Program (VP) mode of operation |
| 1142 | VP start and pre-infusion step |
| 1144 | VP pressure ramp-up step |
| 1146 | VP full pressure brew step |
| 1148 | VP pressure ramp-down step |
| 1149 | VP stop step |
| 1200 | Groups display |

What is claimed is:

1. A group control head (300) for dispensing a controlled dose of espresso from an espresso machine, comprising:
a base (302) having a center axis;
a top plate (324) rigidly fixed to the base, the top plate comprising a pivot pin (325) disposed on the center axis, a centering post (350) disposed at a radial idle position offset orthogonally from the center axis, and at least one proximity sensor (375) disposed at a fixed angle from the radial idle position;
an actuator (340) rotationally disposed on the pivot pin, the actuator including a magnet (342) which is disposed near the radial idle position and adjacent to the centering post; and
a handle (314) fixed to the actuator, the handle disposed to manually rotate the actuator away from the radial idle position in which the magnet is adjacent to the centering post,
wherein the centering post and magnet provide a biasing force that biases the actuator position to automatically return the actuator to the radial idle position.

2. The group control head of claim 1, wherein the actuator magnet is disposed to be adjacent the at least one proximity sensor when in the away from the radial idle position,
wherein the at least one proximity sensor is further disposed to sense the magnet position.

3. The group control head of claim 2, wherein the at least one proximity sensor is a Hall effect sensor.

4. The group control head of claim 1, wherein the at least one proximity sensor is a Hall effect sensor.

5. The group control head of claim 4, further comprising a second proximity sensor (376) disposed on the top plate at a second fixed angle from the radial idle position.

6. The group control head of claim 5, wherein the second fixed angle is opposite the radial idle position from the fixed angle.

7. The group control head of claim 1, further comprising a controller (510) in electrical communication with the at least one proximity sensor,
wherein the at least one proximity sensor senses a rotated away actuator position and provides an input signal to the controller corresponding to the sensed position.

8. The group control head of claim 7, wherein the controller is programmed to provide one of a control output to the espresso machine, a group head programming mode output and a control setting data point to a computer memory in response to the provided input signal.

9. The group control head of claim 7, further comprising a visual display (520) for providing an indication corresponding to an output signal from the controller, the display in electrical communication with the controller.

10. An espresso machine (100) having a control system for controlling the dose dispensed from an espresso machine, comprising:

an espresso dosing unit including a pressurized hot water brew tank (150), a filter (160) for holding grounds, a control valve (206) disposed between the brew tank and the filter, and an outlet spout (170);

a group control head (110, 300) according to claim 1 that provides an input signal from the at least one proximity sensor (375) which indicates an actuation of the group control head;

a pump (204) disposed at an inlet of the brew tank; and a controller (510) in electrical communication with the input signal and in controlling communication (522, 524) with the control valve and the pump, wherein the controller actuates at least one of the pump and the control valve to provide a controlled dose of hot water from the source to the spout in response to the input signal.

11. The espresso machine of claim 10, further comprising a visual display (180, 520) in controllable communication with the controller, the display for providing an indication of the controlled dose.

12. The espresso machine of claim 10, wherein the at least one proximity sensor is a Hall effect sensor.

13. The espresso machine of claim 10, further comprising a bypass control valve (208) disposed between the brew tank and the pump, wherein the actuation of the group control head handle further controls the bypass control valve.

14. The espresso machine of claim 13, wherein the controlled dose is characterized by a variable pressure and controlled volume.

15. The espresso machine of claim 10, wherein the controlled dose is characterized by a variable pressure and controlled volume.

16. The espresso machine of claim 10, wherein a single actuation of the group control head handle generates the input signal, and further wherein the controller responsively actuates the pump and the control valve in a coordinated programmed brew sequence to provide the controlled dose.

17. The espresso machine of claim 10, wherein the group control head further comprises a second proximity sensor (376) disposed on the top plate at a second fixed angle from the radial idle position, the second proximity sensor providing a second input signal which indicates a second actuation of the group control head handle wherein the controller is in electrical communication with the second input signal, and wherein the controller ends the controlled dose responsive to the second input signal.

18. A method (800) of providing a controlled dose of hot water in an espresso machine, comprising the steps of:

providing an espresso machine of claim 10; (804)

sensing an actuating (808) of the group control head handle to an angular brew position; and responsive to the sensing step, controlling (816, 818) at least one of the pump and the valve to provide the controlled dose of hot water.

19. The method of claim 18, further comprising the steps of:

subsequent to the controlling step, a second sensing of the group control head handle actuation (808); and responsive to the second sensing step, controlling (822) both of the pump and the valve to end the controlled dose of hot water.

20. The method of claim 18, further comprising the steps of:

subsequent to the controlling step, a second sensing of the group control head handle actuation (808); and responsive to the second actuating step, controlling (818) a bypass control valve to vary a brewing pressure of the controlled dose of hot water.

* * * * *